United States Patent
Wong et al.

(10) Patent No.: US 6,953,716 B2
(45) Date of Patent: Oct. 11, 2005

(54) POLYSILICON MATERIAL AND SEMICONDUCTOR DEVICES FORMED THEREFROM

(75) Inventors: Man Wong, New Territories (HK); Hoi Sing Kwok, Kowloon (HK); Zhiguo Meng, Kowloon (HK); Mingxiang Wang, New Territories (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 10/740,537

(22) Filed: Dec. 22, 2003

(65) Prior Publication Data

US 2004/0185681 A1 Sep. 23, 2004

Related U.S. Application Data

(63) Continuation of application No. 09/563,752, filed on May 1, 2000, now abandoned.

(51) Int. Cl.$^7$ .............................................. H01L 21/324
(52) U.S. Cl. ........................ 438/166; 438/486; 438/487
(58) Field of Search ................................ 438/155, 163, 438/142, 149, 162, 166, 308, 486, 487

(56) References Cited

U.S. PATENT DOCUMENTS

| | | | | |
|---|---|---|---|---|
| 4,409,724 A | * | 10/1983 | Tasch et al. .................... | 438/30 |
| 5,804,473 A | * | 9/1998 | Takizawa ..................... | 438/166 |
| 5,923,997 A | * | 7/1999 | Mitanaga et al. ............ | 438/486 |
| 6,228,693 B1 | * | 5/2001 | Maekawa et al. ............ | 438/166 |
| 6,361,912 B2 | * | 3/2002 | Fonash et al. ................ | 430/52 |

* cited by examiner

*Primary Examiner*—Amir Zarabian
*Assistant Examiner*—Khanh Duong
(74) *Attorney, Agent, or Firm*—Buchanan Ingersoll PC

(57) ABSTRACT

A metal induced lateral crystallization (MILC) poly-silicon material is produced by depositing a metal in a predefined pattern on amorphous silicon, and heat treating the silicon at a first temperature to form a MILC poly-Si material. The MILC poly-Si material is further heat treated at a second temperature higher than the first temperature to induce recrystallization. The second high temperature recrystallization step significantly enhances the material structure, and in particular the grain structure, of the poly-Si material with substantial benefits to the performance of semiconductor devices made therefrom.

8 Claims, 9 Drawing Sheets

POLYSILICON MATERIAL AND SEMICONDUCTOR DEVICES FORMED THEREFROM

This application is a continuation divisional of Application No. 09/563,752, filed on May 1, 2000 now abandoned.

FIELD OF THE INVENTION

The present invention relates to a novel polysilicon material, and to novel polysilicon based electronic devices, and to fabrication methods therefore. In particular the invention relates to a novel metal induced lateral crystallization poly-silicon fabrication technique and to devices made therefrom.

BACKGROUND OF THE INVENTION

Micro-machined sensors and actuators have been investigated and produced industrially for about 20 years. A range of micro-mechanical sensors has been developed for applications such as process control, bio-medical applications, consumer products and automobiles. Such sensors and actuators may be based on capacitive and piezo-electric sensing schemes, and the piezo-resistive effect (ie stress-induced change in resistivity of the sensing material) has also been widely used.

Until about ten years ago, most piezo-resistive sensors were fabricated on single-crystal silicon (c-Si) substrates using either diffusion or implantation doping techniques to form the piezo-resistors on bulk micro-machined mechanical sensing structures. However, this approach has its limitations. For example, the reverse-biased pn junction that isolates a doped resistor from the substrate can fail at high ambient temperature, which seriously limits the range of possible applications for such devices. While such problems can be overcome by using silicon-on-insulator or silicon-on-sapphire substrates, this is at the expense of substantially higher production costs. Preferred to c-Si therefore is the dielectrically isolated polysilicon and a poly-Si piezoresistor is a more viable alternative.

PRIOR ART

Fine-grained low-pressure chemical vapor deposition (LPCVD) poly-Si has been used as a piezo-resistive material, and in addition micro-crystalline silicon realized from plasma enhanced chemical vapor deposition (PECVD) amorphous silicon (a-Si) has also been investigated. In general, sensors built from such materials typically have much lower piezo-resistive coefficients than those realized from c-Si. The reason for this is that the resistivity of a doped poly-Si resistor is affected by the conduction not only through the grains but also across the grain boundaries. However, the contribution to the piezo-resistivity comes mainly from the conduction through the grains and not the conduction across the grain boundaries, and thus while the grain boundaries contribute substantially to the overall resistivity they contribute negligibly to the piezo-resistivity. This leads to reduced fractional resistivity change under stress and thus to a reduced piezo-resistive coefficient compared to c-Si. Furthermore, the different orientations of the grains further reduce the piezo-resistive sensitivity of poly-Si based sensors.

Temperature and temporal drifts present other important issues for piezo-resistive sensors and the average grain size of the poly-Si will influence the temperature coefficient of resistance (TCR). If it is assumed that thermionic emission across grain boundaries is the dominant conduction mechanism, then poly-Si with larger grains and fewer grain boundaries is expected to have a lower TCR. This would be advantageous because it reduces the requirements for temperature compensation.

Improved piezo-resistive performance has been obtained using laser induced crystallization (LIC). It is believed that the improvement results from the formation of poly-Si with large and elongated grains with fewer grain boundaries. However, large-scale commercial application of LIC to piezo-resistive sensors has been hindered by its inherently low throughput. Furthermore, a flexible layout of the resistor pattern is difficult to achieve since the elongated grains are only formed in the direction parallel to the laser scan.

Metal-induced lateral crystallization (MILC) technology was initially developed as a low-temperature (<550–600° C.) crystallization technique for making high performance poly-Si thin film transistors. Low temperature technology was developed because of its application in the realization of commercial flat panel displays (FPD) on inexpensive glass substrates where the maximum process temperature is limited to less than 600° C.

SUMMARY OF THE INVENTION

According to the present invention there is provided a method of forming a metal induced lateral crystallization (MILC) poly-silicon material comprising the steps of (a) depositing a metal in a predefined pattern on amorphous silicon, (b) heat treating the silicon at a first temperature to form a MILC poly-Si material, and (c) further heat treating the MILC poly-Si material at a second temperature to induce recrystallization, wherein the second temperature is higher than the first temperature.

It has been found that the second high temperature recrystallization step significantly enhances the material structure, and in particular the grain structure, of the poly-Si material with substantial benefits to the performance of semiconductor devices made therefrom.

The first heat treatment is a conventional low temperature heat treatment carried out at a temperature of not exceeding about 600° C., whereas the second heat treatment may be regarded as a high temperature treatment and is carried out at a range of from about 700° C. to about 1250° C.

Wherein the manufacture of a semiconductor device the poly-Si material is doped (for example by boron diffusion) the high temperature recrystallization heat treatment may be effected by a dopant activation step. Any convenient heat treatment method may be employed such as furnace heating, rapid thermal heating and laser induced heating.

The metal may be any conventional metal used in MILC techniques, preferably Ni, but possibly any of Pd, Co, Ti, Pt and W.

The present invention provides a technique for producing high-quality MILC poly-Si material that may be employed in a wide range of semiconductor devices.

According to another aspect of the present invention therefore, there is provided a semiconductor device comprising a metal induced lateral crystallization poly-silicon material, wherein said poly-silicon material has been subject to high temperature recrystallization. The semiconductor device may be, for example, a resistor, piezo-resistor, thermistor, pressure sensor, temperature sensor, photodetector, infrared sensor or transistor.

In particular, according to one further aspect of the invention there is provided a piezo-resistor comprising a MILC poly-Si material wherein said material has been subject to a high temperature recrystallization step at between 700° C. and 1250° C.

Viewed from another particular aspect of the invention there is provided a thermistor comprising a MILC poly-Si material wherein said material has been subject to a high temperature recrystallization step at between 700° C. and 1250° C.

Viewed from a still further aspect of the invention there is provided a thin film transistor comprising a MILC poly-Si material wherein said material has been subject to a high temperature recrystallization step at between 700° C. and 1250° C.

BRIEF DESCRIPTION OF TEE DRAWINGS

Several embodiments of the invention will now be described by way of example and with reference to the accompanying drawings, in which:

FIG. 1 is an optical micro-graph of two partially crystallized a-Si resistor islands during a fabrication process according to a first embodiment of the invention, FIG. 2 is an optical micro-graph of a pressure sensor according to an embodiment of the invention attached to a micro-channel, FIG. 3 is a comparison of the pressure sensitivities of piezo-resistive pressure sensors formed in accordance with an embodiment of the invention and in the prior art, FIG. 4 is a comparison of the thermal coefficient of resistance of piezo-resistive pressure sensors formed in accordance with an embodiment of the invention and in the prior art, FIG. 5 is a comparison of the thermal coefficient of sensitivity of piezo-resistive pressure sensors formed in accordance with an embodiment of the invention and in the prior art, FIG. 6 is a plot showing the short-term zero-point drift of a MILC pressure sensor according to an embodiment of the invention, FIG. 7 is a plot showing the Hall mobility and carrier concentration in MILC poly-Si material according to an embodiment of the invention and prior art LPCVD poly-Si.

FIG. 8 shows the dependence of the room temperature resistivity on doping concentration for MILC poly-Si material resistors according to an embodiment of the invention, conventional poly-Si material and bulk-Si, FIG. 9 compares the current noise spectra for MILC poly-Si resistors according to an embodiment of the invention with conventional LPCVD poly-Si resistors, FIG. 10 plots the normalised resistance of MILC poly-Si resistors according to an embodiment of the invention perpendicular and parallel to the MILC direction, FIG. 11 shows the transfer characteristics of n- and p-type MILC poly-Si transistors according to an embodiment of the invention, FIG. 12 shows the output characteristics of n- and p-type MILC poly-Si transistors according to an embodiment of the invention, and FIG. 13 shows the transfer characteristic of a CMOS inverter fabricated using MILC poly-Si of the present invention.

DETAILED DESCRIPTION OF PREFERRED EMBODIMENTS

The fabrication of piezo-resistive pressure sensors using MILC poly-Si according to a first embodiment of the invention will now be described by way of example.

Micro-channels with integrated pressure sensors were fabricated using a combination of bulk and surface micro-machining techniques for measuring the pressure distributions in a variety of micro-fluidic systems as described in X. X. Li, W. Y Lee, M. Wong and Y. Zohar, "*Constriction micro-devices with integrated pressure sensors for flow separation study*" Technical Digest of the $10^{th}$ International Conference on Solid-State Sensors and Actuators, Transducers '99, Sendai, Japan, 7–10Jun. 1999, Paper No.3B1.4. Starting with 100 mm-diameter (100) Si wafers, layers of 0.9 $\mu$m low temperature silicon dioxide (LTO) and 0.25 $\mu$m phosphosilicate glass (PSG) containing 6% phosphorous were deposited in sequence. After 30 minutes of densification at 1000° C., the composite sacrificial layers were patterned and the fluid inlet/outlet holes were introduced from the back sides of the wafers using aqueous etchant tetramethy ammonium hydroxide (TMAH).

Low-stress silicon nitride film, 1.2 $\mu$m thick, was deposited at 840° C. in an LPCVD reactor to form the pressure sensitive diaphragms and the channel cavity walls. A tensile residual stress of 280 Mpa was measured. Etching the sacrificial layers in concentrated (40% wt) HF solution formed the diaphragms and the channel/pressure cavities. The etching holes were sealed by the subsequently deposited LTO layer, which was thick enough to fill the holes and patterned to avoid any stress gradient across a composite LTO/silicon nitride diaphragm.

0.5 $\mu$m LPCVD a-Si was deposited at 545° C. and etched to form serpentine piezo-resistive islands both near the center and the supporting peripheral regions of the diaphragms. Longitudinal resistor patterns were used, since the transverse piezo-resistive effect was known to be low for poly-Si. Some a-Si was also left on top of the etching holes to enhance their sealing.

A 10 nm Ni film was deposited using electron beam evaporation in a high vacuum chamber and patterned using a lift-off technique to leave a Ni pad on one end of each resistor, as shown in FIG. 1. Crystallization proceeded from the Ni-covered end of the resistor during a subsequent heat treatment at 500° C. in nitrogen in a conventional atmospheric pressure furnace. For resistor patterns longer than 100 $\mu$m, Ni was deposited on both ends of the patterns to reduce the required crystallization time.

For comparison, piezo-resistors were also constructed on different wafers with 0.5 $\mu$m thick conventional LPCVD poly-Si deposited at 620° C. Both the MILC and the conventional poly-Si resistors were boron doped simultaneously at 900° C. in a diffusion furnace and the boron doping concentration was estimated to be about $7 \times 10^{18}$ $cm^{-3}$. In addition, in the MILC poly-Si resistors this dopant activation step also serves as a high-temperature recrystallization step. It should be noted, however, that the dopant activation step and the recrystallization step could be performed separately, possibly at different temperatures. A slightly lower average resistance was measured for the MILC than for the conventional poly-Si resistors. However, similar resistance values could be found for both types of resistors since there was an overlap in the corresponding distribution of the resistance values.

Following the resistor formation, a thin 0.1 $\mu$m thick LTO passivation layer was deposited. Finally, contact holes re opened and aluminium was sputter deposited, patterned to form the metal interconnections, and sintered.

FIG. 2 shows a section of a typical micro-channel with an integrated pressure sensor. The edge dimension of the square sensor diaphragm is 100 $\mu$m. The Wheatstone bridge for measuring the differential stress is made up of four piezo-resistors.

The performance of the pressure sensors of the first embodiment of the invention realized using MILC was compared with conventional poly-Si piezo-resistors. The sensor resistors were selected to have similar resistance values at zero differential pressure across the diaphragms. A low DC voltage of 1V was applied to minimize any instability associated with Joule heating of the resistors.

Figure 1:
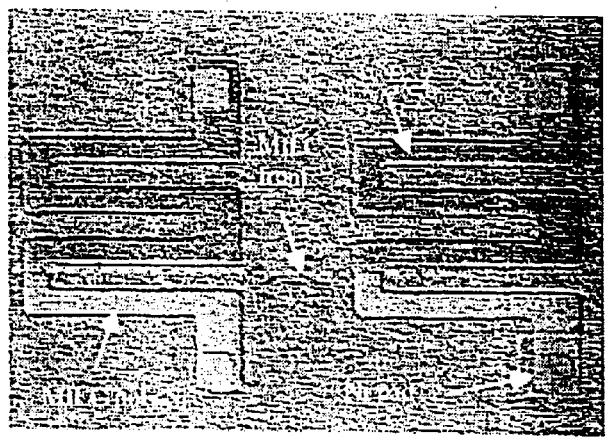
Figure 6:
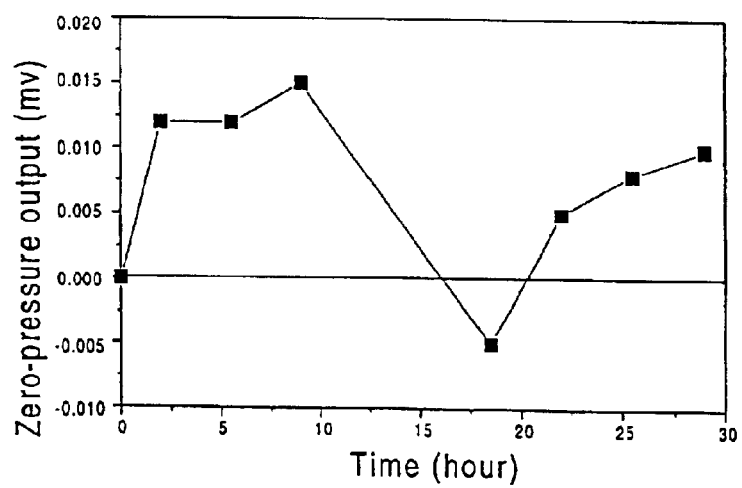
Figure 2:
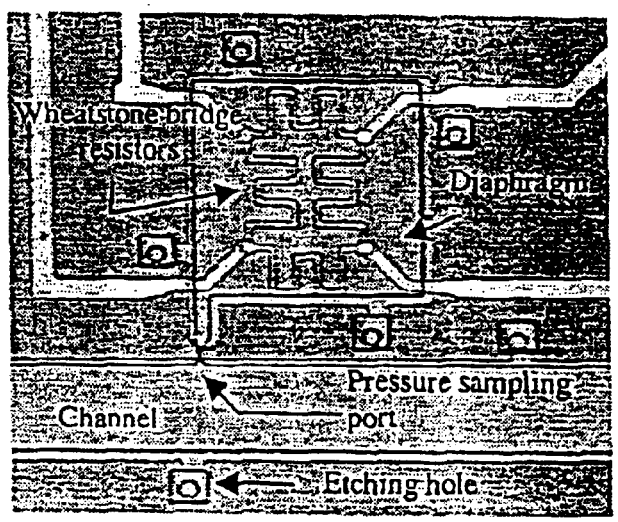
Figure 3:
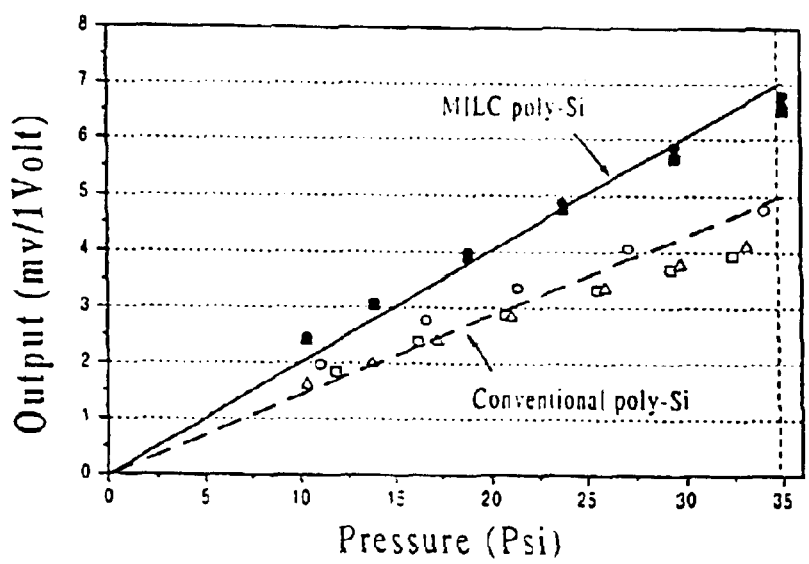
FIG. 3 shows the measured pressure sensitivities. The sensitivity of the sensors employing piezo-resistors according to this embodiment of the invention are about 40% higher than the prior art and this improvement can be attributed to the elongated grains in the MILC poly-Si with few transverse grain boundaries.
Figure 4:
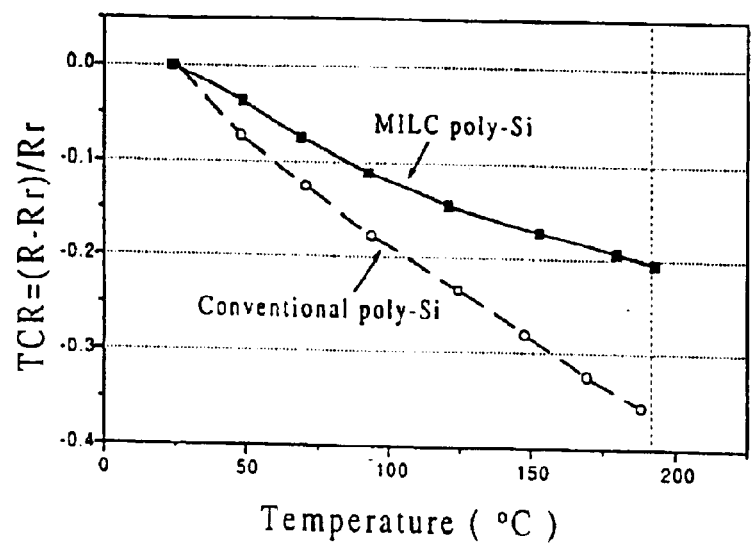
FIG. 4 shows that the TCR of the MILC poly-Si resistors of this embodiment is about −0.12%/° C. which is about half that of the prior art resistors.
Figure 5:
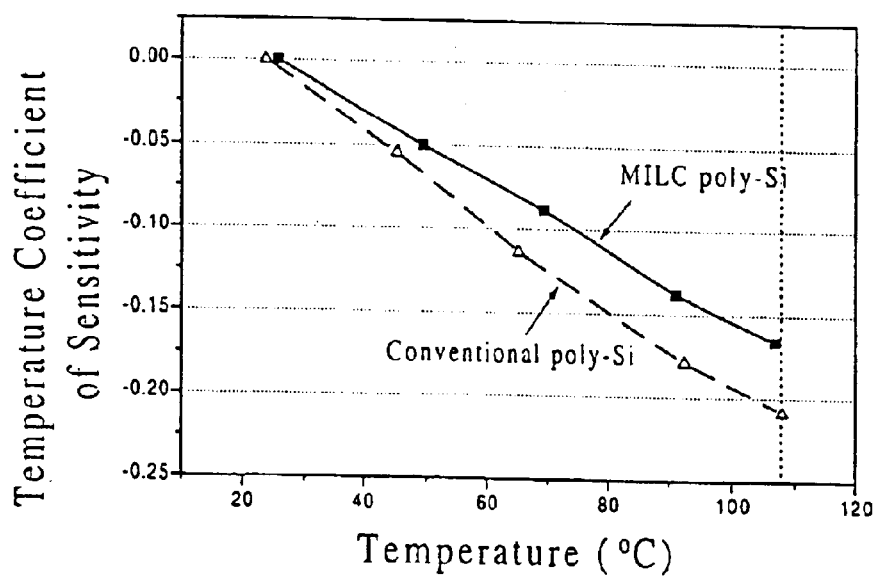
FIG. 5 shows that the temperature coefficient of the pressure sensitivity (TCS) for the MILC poly-Si sensor of the present invention, at −0.2%/° C. is also smaller than that of the prior art (−0.25%/° C.).

FIG. 6 shows the temporal drift in the zero pressure output of a sensor with MILC poly-Si piezo-resistors according to the present invention. The test was conducted in an air-conditioned environment with a temperature range of 18–22° C. For the full scale of 7 mV shown in FIG. 3, the offset drift during a test period of about 30 hours was smaller than ±0.16%.

In addition to piezo-resistors, the present invention is also applicable to a wide range of other semi-conductor devices such as resistors, transistors and other circuit elements. In the following embodiments, the formation of MILC poly-Si begins with the deposition and patterning of LPCVD amorphous Si. This is followed by the evaporation of Ni onto selected regions of the patterned a-Si islands. MILC is carried out in an inert ambient in a conventional furnace at 500–550° C. until the islands are crystallized. After crystallization a high temperature anneal at 900° C. to 1000° C. is included to further improve the material quality of the MILC poly-Si by recrystallization and, if desired, to convert any remaining a-Si to regular fine grain poly-Si by SPC.

A comparison of the material quality (Table I) clearly shows that MILC poly-Si is superior to conventional LPCVD poly-Si. The number of grain boundary (GB) traps per unit GB area is about three times lower in MILC poly-Si than in LPCVD poly-Si. This results in a much lower GB potential barrier in the intermediate doping range, thus greatly enhancing the conductivity of MILC poly-Si. The low number of GB defects, combined with the large average grain size, gives rise to significantly reduced effective volumetric GB trap density in MILC poly-Si. A unique characteristic of MILC poly-Si is that its grains are elongated along the MILC direction. Consequently there is a resistive anisotropy that can be exploited in many applications.

In an embodiment of the invention, MILC poly-Si resistors, 400 nm thick, were doped by boron implantation to levels ranging from $5 \times 10^{17}$ to $2 \times 10^{19}$ cm$^{-3}$. A 1000° C./30 minutes thermal schedule was used to activate the dopants and to further improve the material quality of the MILC poly-Si by recrystallization. Control samples of conventional LPCVD 620° C. poly-Si were also fabricated for comparison.

Figure 7:
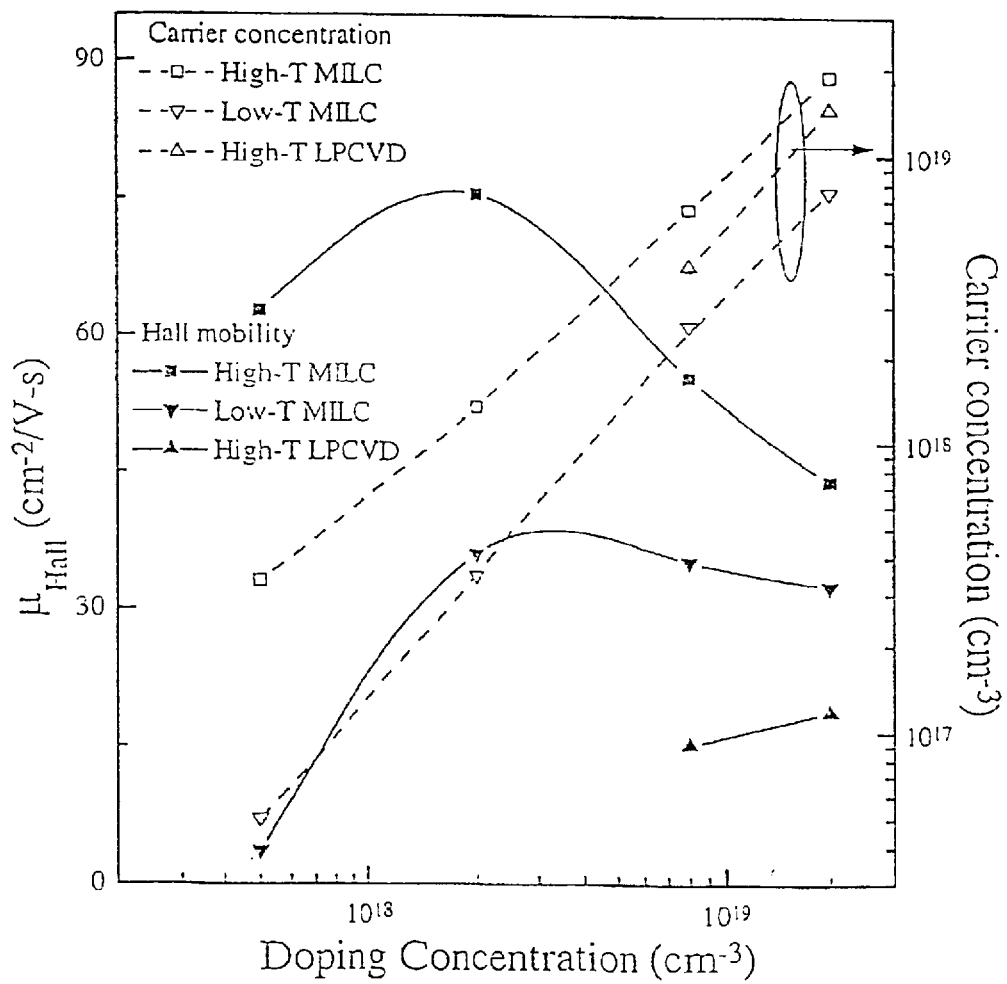

FIG. 7 shows the Hall mobility and the carrier concentration for both MILC poly-Si of the present invention and LPCVD resistors of the prior art. It should be noted that at high doping concentrations when the highest mobility is obtained for conventional LPCVD poly-Si, the hole mobility of the MILC poly-Si of the present invention is still 3–4 times higher.

Figure 8:
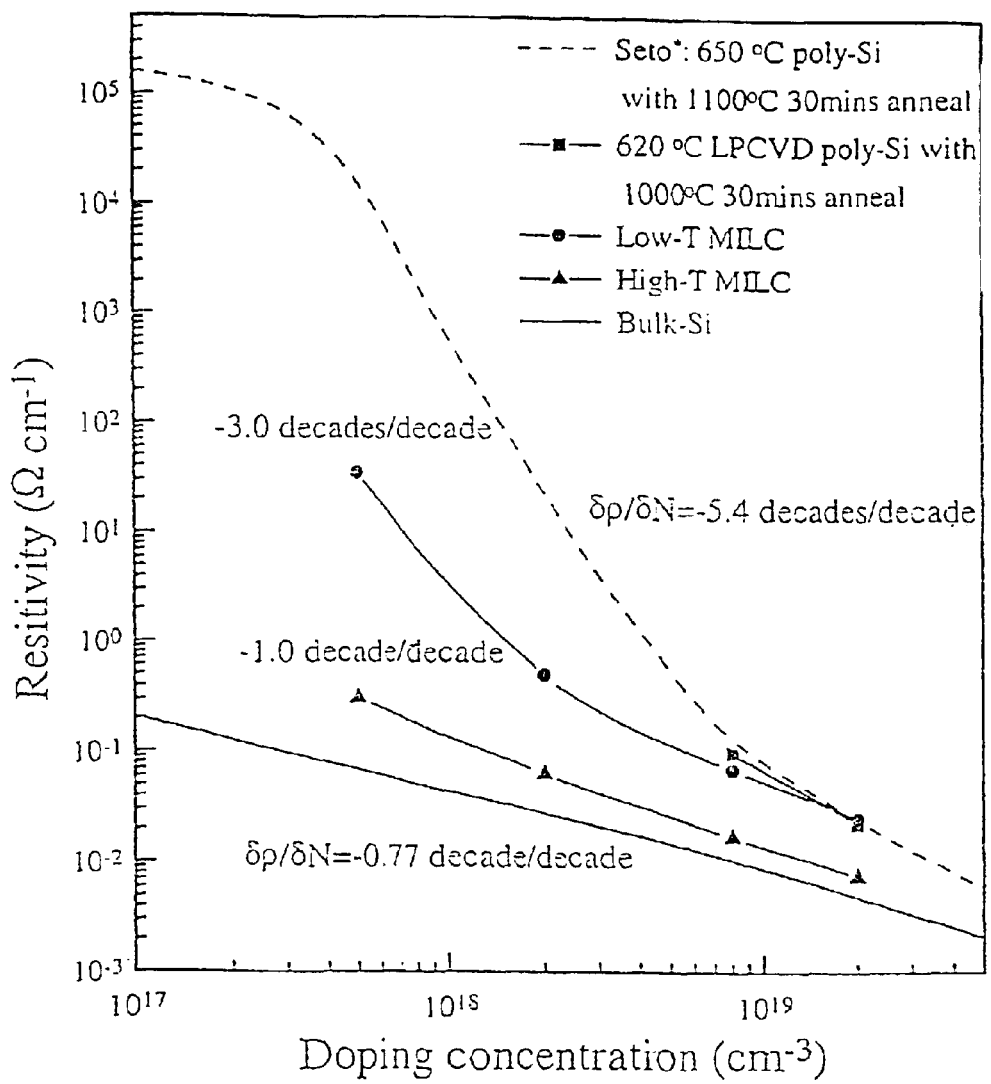

FIG. 8 shows the dependence of the room temperature resistivity on doping concentration for MILC poly-Si of the present invention, conventional poly-Si and bulk-Si. It will be noted that a high sensitivity of resistivity on doping concentration is observed in conventional poly-Si, but this dependence is much less marked in MILC poly-Si of the present invention which is only slightly more sensitive than bulk Si. This makes MILC poly-Si of the present invention a more suitable material for applications where precise control of the resistance is needed.

Figure 9:
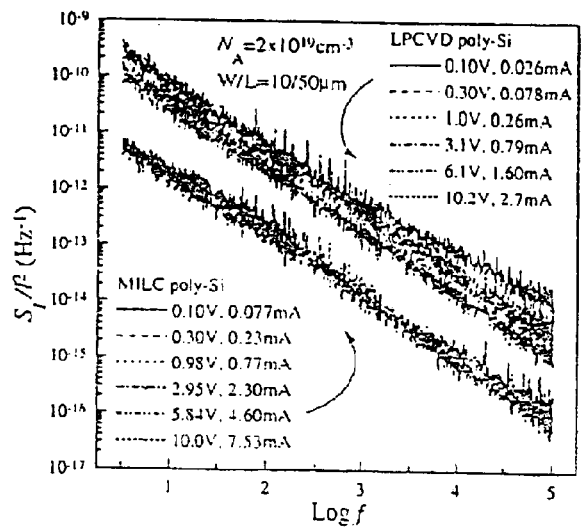

FIG. 9 compares the normalized low-frequency current (I) noise spectral intensities $S_I/I^2$ at different I for MILC poly-Si resistors of the present invention and LLPCVD poly-Si resistors of the prior art. While the noise spectra of both types of resistor follow the commonly observed 1/f dependence, the intensity is lower by two orders of magnitude in the MILC poly-Si resistors of the present invention. Furthermore, in the bias range of 0.1 to 10V, $S_I$ of MILC poly-Si increases in exact proportion to $I^2$ as indicated by the overlap of the spectral intensity curves, whereas this is not the case for the conventional LPCVD poly-Si resistors.

Figure 10:
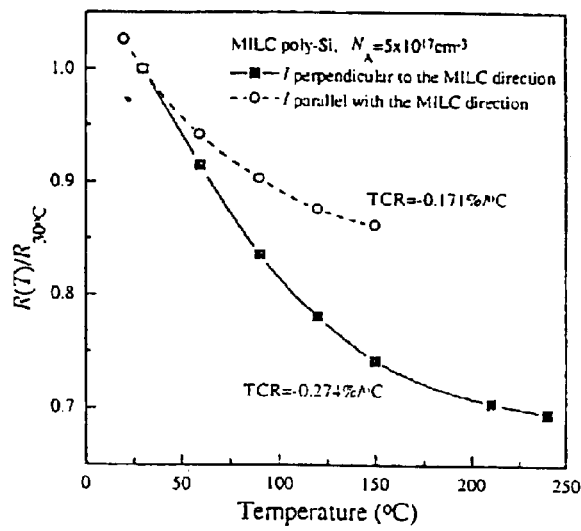

In a further embodiment of the invention, a MILC poly-Si based thermistor may be fabricated by doping in the low to median range to produce high GB potential barriers such that conduction is dominated by thermionic emission over these barriers and high TCR can be obtained. Because of the anisotropy of the elongate grains formed by the MILC poly-Si of the present invention, there is an anisotropy in the conduction parallel to transverse to the MILC direction. FIG. 10 compares the TCR perpendicular to the MILC direction and parallel to the MILC direction. At −0.274%/K, the TCR for transverse conduction is about 60% larger than the TCR of −0.171%/K for parallel conduction. This anisotropy can be exploited in the design of thermistors. For applications involving temperature sensing, a large TCR is beneficial and can be obtained by designing the thermistor with conduction transverse to the MILC direction. For other applications where thermal stability is important, conduction parallel to the MILC direction is preferred.

TABLE I

|  | Grain structure | Grain size (μm) | GB trap density (cm$^{-2}$) | Volumetric GB trap density (cm$^{-3}$) | Texture |
|---|---|---|---|---|---|
| MILC poly-Si | Elongated grains along the MILC direction | Width > 1 Length > 5 | $5.4 \times 10^{11}$ *$1.0 \times 10^{12}$ | <$5.4 \times 10^{15}$ <*$1.0 \times 10^{16}$ | (110) preference |
| LPCVD poly-Si | Fine-grain random structure | ~0.04 | $1.9 \times 10^{12}$ *$3.9 \times 10^{12}$ | ~$5.0 \times 10^{17}$ *$1.0 \times 10^{18}$ | No preference |

*Data before high temperature anneal

Figure 11:
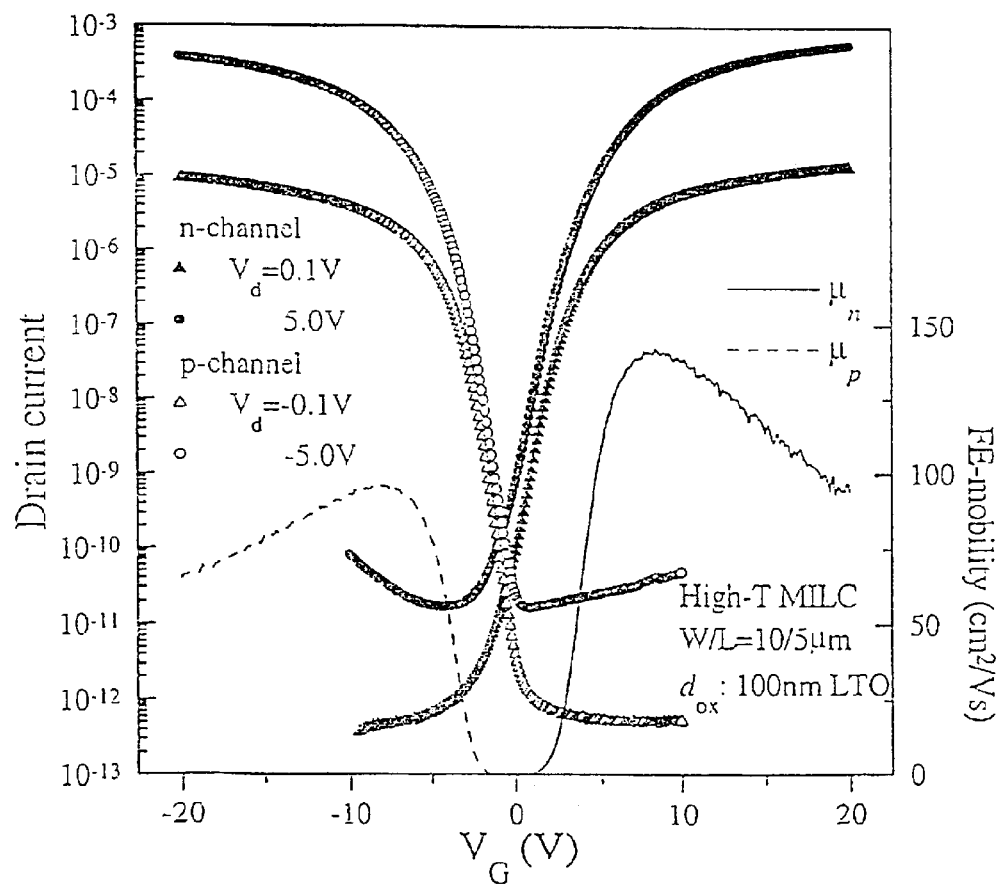

In addition to passive elements such as resistors, piezo-resistive sensors, and thermistors, the present invention may also be applied to active elements such as thin film transistors formed on MILC poly-Si and FIG. 11 shows the transfer characteristics for both n- and p-type channel devices at two different drain voltage values. Threshold voltage values of about 5 and −5V were measured for the n and p type TFTs respectively. The high leakage current typically observed in conventional poly-Si TFTs is greatly reduced and an on/off current ratio exceeding $10^7$ is obtained by the MILC poly-Si TFTs of the present invention. At 150/100 cm$^2$/Vs the field effect $\mu$ of the n-/p-type channel MILC poly-Si TFTs of the present invention is significantly higher than that of conventional low temperature poly-Si devices. In this embodiment of the invention, the TFT poly-Si is recrystallized at about 900° C.

Figure 12:
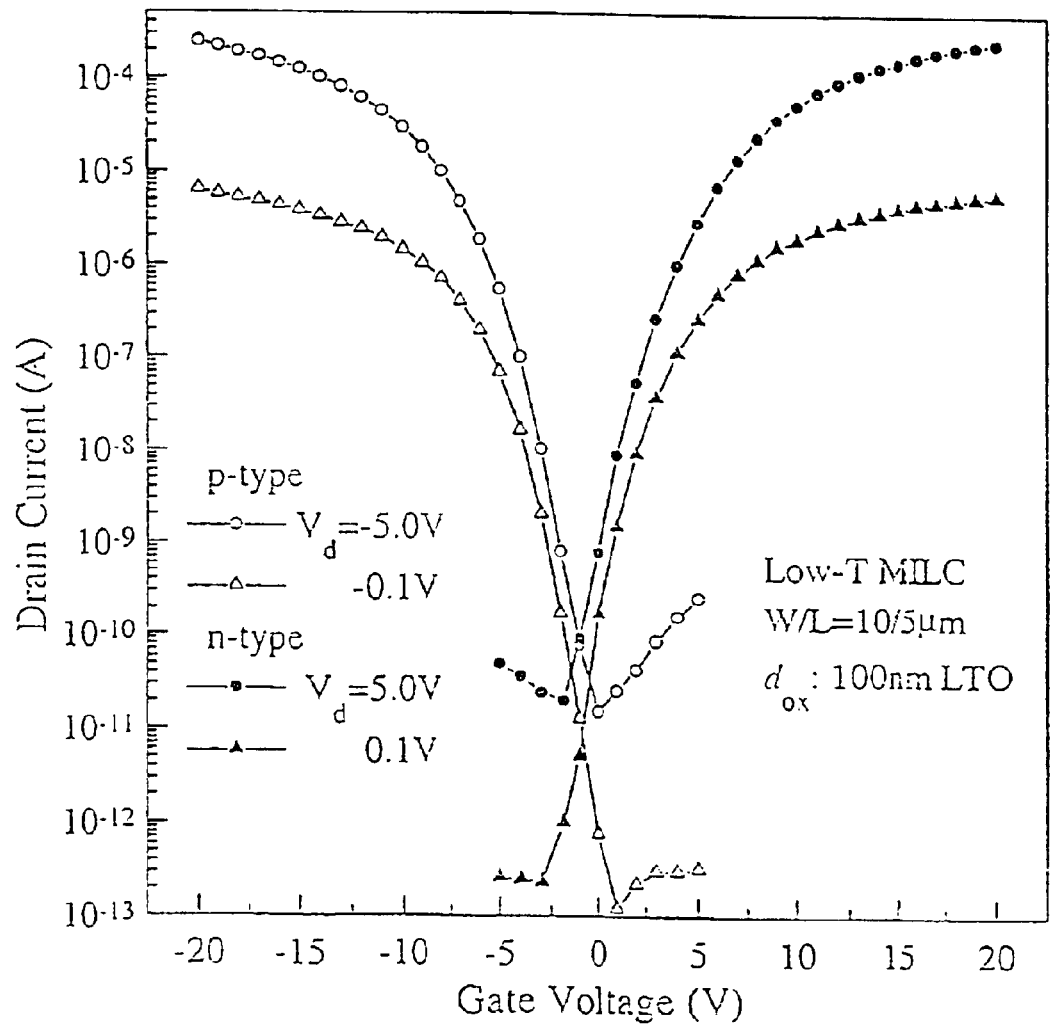
Figure 13:
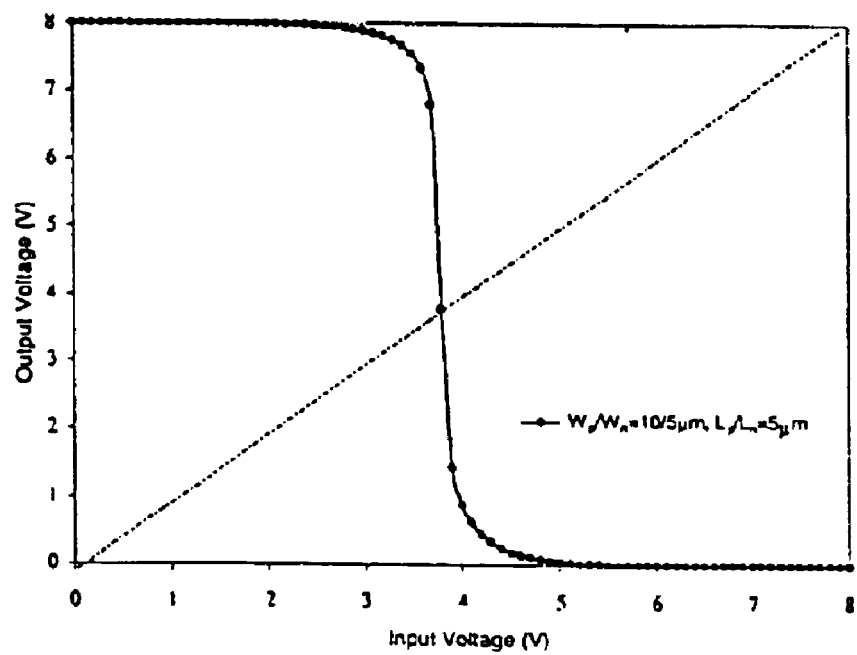

FIG. 12 shows the output characteristics of the MILC poly-Si TFTs of the present invention and it will be seen that the high drive current resulting from the high field effect and the good saturation behaviour are evident in the output characteristics of the TFTs. The excellent characteristics of the devices according to the present invention make them suitable for building many CMOS electronic circuits. Shown in FIG. 13 for example, is the transfer characteristic of a CMOS inverter using MILC poly-Si TFTs of the present invention. The transfer curve is nearly symmetrical with a steep transition width of about 0.5V located close to the half of the supply voltage.

It will be seen that the present invention provides a method of forming MILC poly-Si material of high quality by performing a high temperature recrystallization step. The novel MILC poly-Si material may be used in the manufacture of a wide range of passive and active semiconductor devices. Furthermore, since MILC poly-Si can be formed selectively, and hence can co-exist on a wafer with conventional poly-Si, a variety of integrated micro-systems can be realized, combining the high performance MILC poly-Si sensing and electronic devices with conventional poly-Si mechanical elements.

What is claimed is:

1. A method of forming a metal induced lateral crystallization poly-silicon material comprising the steps of:
    (a) depositing a metal in a predefined pattern on amorphous silicon,
    (b) heat treating the silicon at a first temperature to form metal-induced lateral crystallization (MILC) poly-Si material, and
    (c) further heat treating the MILC poly-Si material at a second temperature to induce recrystallization,
   wherein the second temperature is higher then the first temperature.

2. A method as claimed in claim 1 wherein the first heat treatment is carried out at less than about 600° C.

3. A method as claimed 1 wherein the second heat treatment is carried out in the range of from 700° to 1250° C.

4. A method as claimed in claim 1 further including the step of activating a dopant during the second heat treatment step.

5. A method as claimed in claim 1 wherein said first and second heat treatment steps are selected from the group consisting of furnace heating, rapid thermal heating, and laser induced heating.

6. A method as claimed in claim 1 wherein said metal is selected from the group consisting of Ni, Pd, Co, Ti, Pt and W.

7. A method as claimed in claim 1 wherein the MILC poly-Si is formed on a substrate of single crystal silicon, glass or poly-silicon.

8. A method as claimed in claim 2 wherein the second heat treatment is carried out in the range of from 700° to 1250° C.

* * * * *